United States Patent
Kautzer et al.

(10) Patent No.: US 7,216,423 B2
(45) Date of Patent: May 15, 2007

(54) MANUFACTURING PROCESS FOR SMALLER ACTIVE AREAS IN FLAT PANEL X-RAY DETECTORS

(75) Inventors: Jeffrey A. Kautzer, Pewaukee, WI (US); Richard Aufrichtig, Mountain View, CA (US); John French, Wauwatosa, WI (US)

(73) Assignee: General Electric Company, Schenectady, NY (US)

( * ) Notice: Subject to any disclaimer, the term of this patent is extended or adjusted under 35 U.S.C. 154(b) by 438 days.

(21) Appl. No.: 10/840,896

(22) Filed: May 7, 2004

(65) Prior Publication Data

US 2005/0109945 A1  May 26, 2005

Related U.S. Application Data

(60) Provisional application No. 60/525,348, filed on Nov. 26, 2003.

(51) Int. Cl.
*H01R 9/00* (2006.01)
*H05K 3/00* (2006.01)

(52) U.S. Cl. .............. 29/842; 29/846; 29/849; 29/854; 250/370.08; 250/370.09; 257/438; 438/73

(58) Field of Classification Search .......... 29/842, 29/846, 849, 854; 250/370.08, 370.09; 257/438; 438/73

See application file for complete search history.

(56) References Cited

U.S. PATENT DOCUMENTS

| | | | |
|---|---|---|---|
| 4,543,443 A * | 9/1985 | Moeller et al. | 136/256 |
| 6,396,253 B1 * | 5/2002 | Petrick et al. | 324/73.1 |
| 6,559,451 B1 * | 5/2003 | Izumi et al. | 250/370.08 |

\* cited by examiner

*Primary Examiner*—A. Dexter Tugbang
*Assistant Examiner*—Tim Phan
(74) *Attorney, Agent, or Firm*—McAndrews, Held & Malloy, Ltd.; Peter J. Vogel; Michael A. Dellapenna

(57) ABSTRACT

The present invention relates to a method for forming an active area or flat panel in an X-ray detector device. The method comprises forming at least one flat form factor panel in a first size on a substrate of a second size and extending at least one contact of the at least one flat form factor panel. The method further comprises trimming the substrate to the first size forming the at least one flat panel.

6 Claims, 4 Drawing Sheets

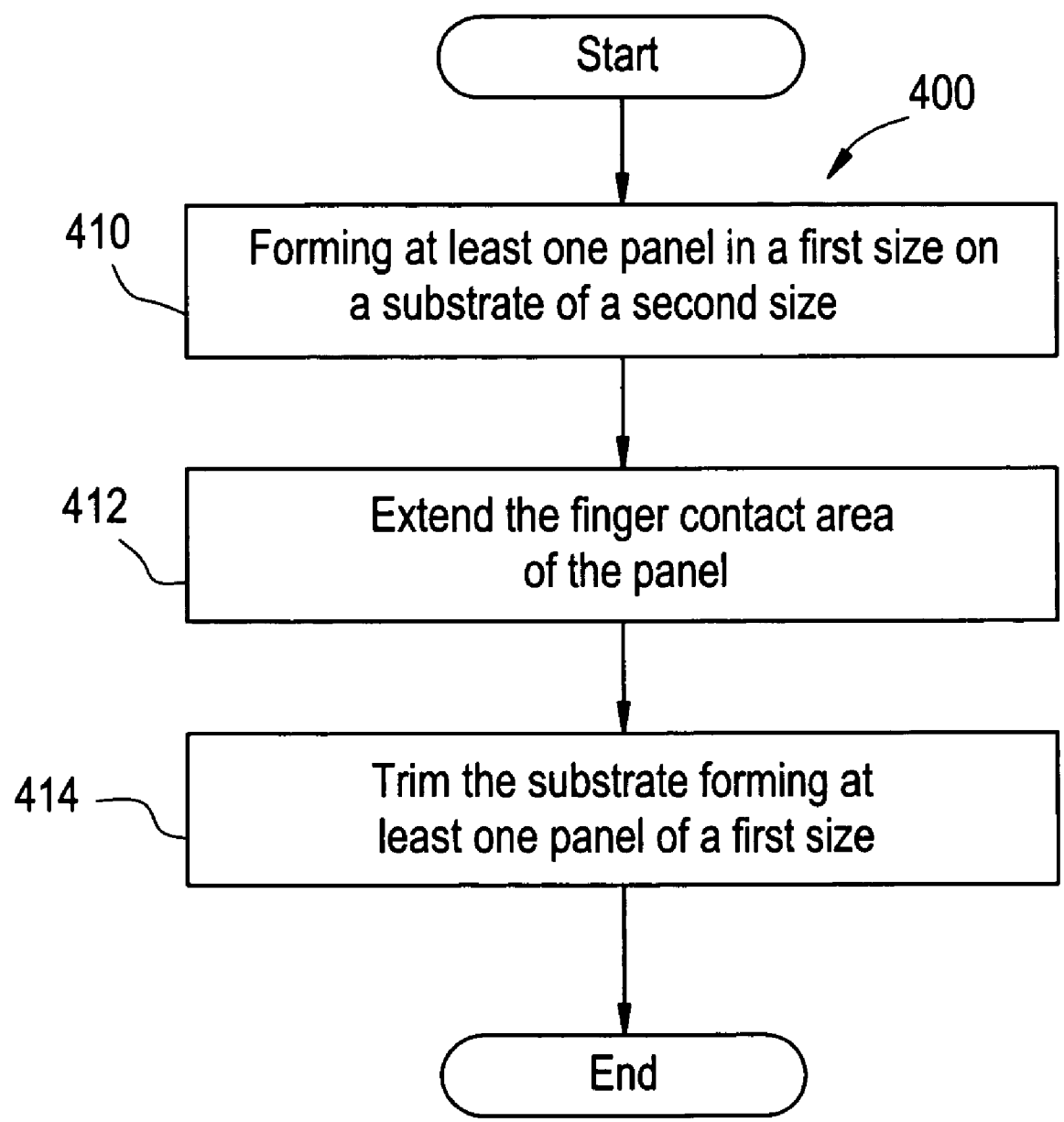

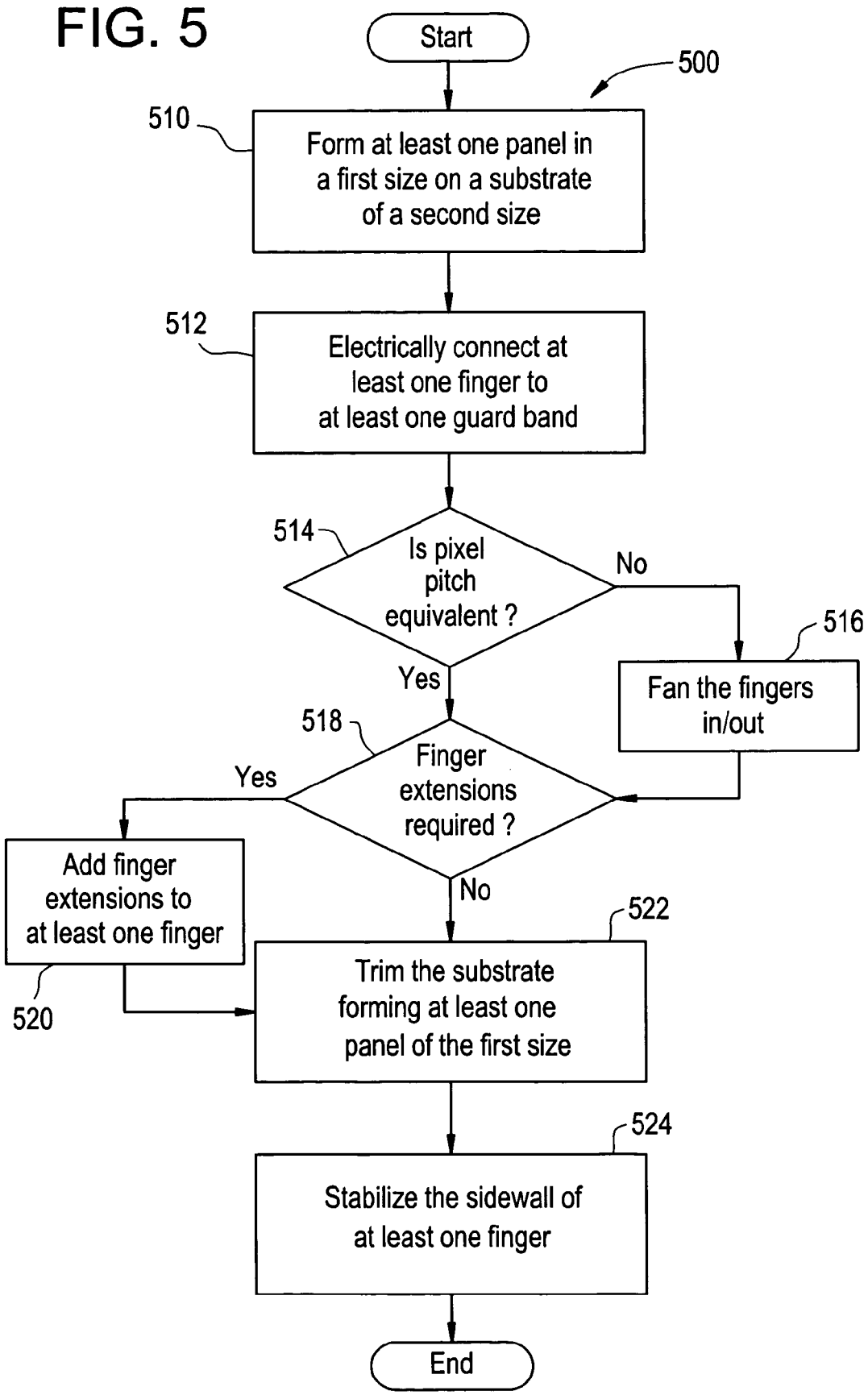

MANUFACTURING PROCESS FOR SMALLER ACTIVE AREAS IN FLAT PANEL X-RAY DETECTORS

This application is related to, and claims benefit of and priority from, Provisional Application No. 60/525,348 filed on Nov. 26, 2003 titled "Design and Manufacturing Process for Smaller Active Areas in Flat Panel X-Ray Detectors", the complete subject matter of which is incorporated herein by reference in its entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

This application is directed in general to a design and manufacturing process for small active areas or form factor panels. This application is directed in particular to the design and manufacture of smaller active areas or form factor panels used in flat panel X-ray detectors, which in turn may be used in medical devices or apparatuses for example.

It should be appreciated that the engineering and manufacturing process of active areas or form factor panels adapted to be used in X-ray detectors for example, is a complex endeavor. The production of such areas or panels typically involves many steps. It is typically advantageous to test the form factor panels at interim stages in the manufacturing process so that defects may be detected early, promoting repair and/or providing for less costly termination of the manufacturing process. Such testing typically involves using complex and delicate electromechanical contacting systems designed specifically for a given active area or panel size.

These specifically designed electromechanical contacting systems (engineering, production and manufacturing test equipment or systems for example) make temporary contact with the outside finger contacts of the form factor panels and measure a number of important parameters including interconnection integrity, TFT operation, diode performance, etc. The test equipment may also include scanning and data acquisition electronics so that every pixel on the panel may be addressed (i.e., tested) in some fashion. Such specifically designed testing systems may utilize dark conditions (no energy stimulus) or visible light stimulus, as well as X-ray stimulus to test the panels, depending upon where the testing point is inserted in the production process.

Currently, such engineering and manufacturing test equipment of this type is largely of custom design, and thus very expensive to develop. Typically, a new panel size generally means that a new set of development and production test equipment needs to be designed and constructed. It is therefore highly desirable to maximize the amount of reuse of the test equipment between panels of differing physical sizes.

BRIEF SUMMARY OF THE INVENTION

One embodiment of the present invention relates to an active area or form factor panel used in an X-ray detector, and an active area or panel formed by such a method, that is adapted to be used with existing production and testing equipment. At least one embodiment of the present invention relates to a method for manufacturing at least one flat panel. In this embodiment, the method comprises forming at least one panel in a first size on a substrate of a second size and extending at least one contact of the at least one panel. The method further comprises trimming at least the substrate to the first size forming the at least one flat panel.

Embodiments are contemplated in which at least one contact is connected (electrically for example) to at least one guard band. Other embodiments are contemplated wherein it is determined if a pixel pitch of at least one contact is equivalent to a pixel pitch of at least one of production equipment and testing equipment. If the pixel pitch is not equivalent, one embodiment of the method comprises fanning the at least one contact in or out to match the pixel pitch of the at least one production equipment and testing equipment.

Other embodiments of the present invention comprise determining if at least one contact extension is required. This embodiment comprises adding at least one contact extension to the at least one contact if a contact extension is required. The method may further comprise stabilizing at least one sidewall of the at least one contact, where stable conductor metallization (using indium tin oxide for example) is used to stabilize the at least one sidewall of at least one contact.

At least one embodiment of the present invention comprises a method for manufacturing a plurality of flat panel X-ray detectors having at least one active area. This embodiment comprises forming at least one flat active area of a first size on a substrate of a second size and connecting a plurality of finger contacts of the at least one flat active panel to at least one guard band. The method further comprises determining if a pixel pitch of the plurality of finger contacts is equivalent to a pixel pitch of at least one of production equipment and testing equipment and determining if at least one finger extension is required. The substrate comprises trimming the substrate to the first size and stabilizing at least one sidewall of at least one of the plurality of fingers, forming the plurality of flat panel X-ray detectors having the at least one active area.

Still another embodiment relates to a flat panel X-ray detector having at least one active area formed by a manufacturing process. This embodiment of the manufacturing process comprises forming at least one active area in a first size on a substrate of a second size and extending at least one contact of the at least one active area. The manufacturing process further comprises trimming the substrate to the first size forming the X-ray detector having at least one active area. In at least one embodiment, the at least one contact is connected to at least one guard band.

BRIEF DESCRIPTION OF SEVERAL VIEWS OF THE DRAWINGS

FIG. 4 illustrates a high level flow diagram depicting a method for forming a small active area or form factor panel in accordance with certain embodiments of the present invention.

FIG. 5 illustrates a detailed flow diagram depicting a method for forming a small active area or form factor panel in accordance with certain embodiments of the present invention.

Figure 1:
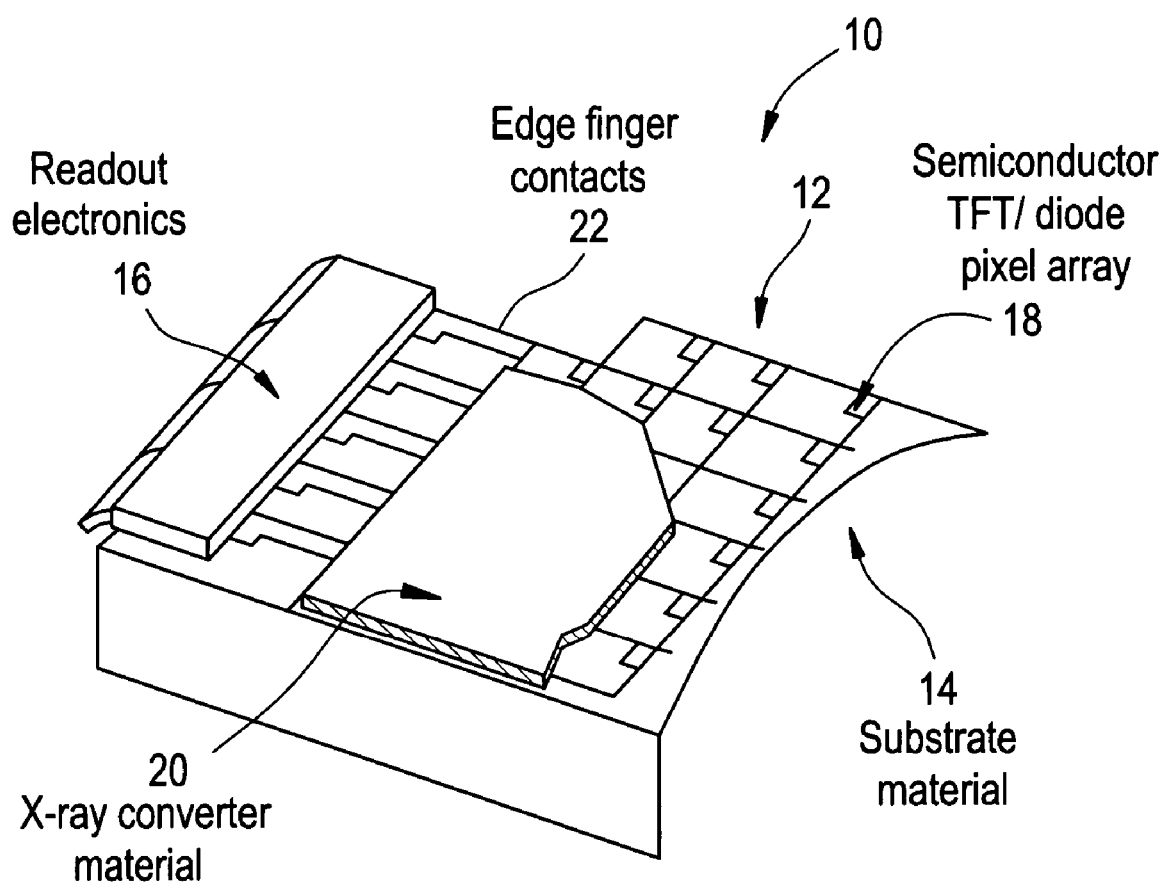
FIG. 1 illustrates a partially broken away perspective view of a typical X-ray detector using flat panels in accordance with certain embodiments of the present invention.

The foregoing summary, as well as the following detailed description of certain embodiments of the present invention, will be better understood when read in conjunction with the appended drawings. For the purpose of illustrating the invention, certain embodiments are shown in the drawings. It should be understood, however, that the present invention is not limited to the arrangements and instrumentality shown in the attached drawings.

DETAILED DESCRIPTION OF THE INVENTION

For the purpose of illustration only, the following detailed description references certain embodiments of an X-ray detector (a flat panel X-ray detector) used in medical devices or apparatuses. However, it is understood that the present invention may be used with other devices or systems using flat panels or active areas.

It should be appreciated that the engineering and manufacturing process of active areas or flat form factor panels, used in X-ray detectors for example, is a complex endeavor. Such engineering and manufacturing processes requires knowledge of amorphous or single/poly crystaline semiconductor devices such as Thin Film Transistors (TFT Field Effect Transistors) and wide bandgap Photodiodes for example. Furthermore, deposition processes such as Plasma Enhanced Chemical Vapor Deposition (alternatively referred to as "PECVD") and sputtering are typically used to produce interconnecting metal, device structures, X-ray converters and other structures in such engineering and manufacturing processes.

As provided previously, the production of active areas or panels typically involves many steps. Generally, the panels are tested at interim stages in the manufacturing process so that defects may be detected early, promoting repair and/or providing for less costly termination. Such testing typically involves using complex and delicate electromechanical contacting systems designed specifically for a given panel size.

Such specifically designed electromechanical contacting systems (engineering, production and manufacturing test equipment or systems for example) make temporary contact with the outside fingers of the active areas or flat panels measure a number of important parameters including interconnection integrity, TFT operation, diode performance, etc. The test equipment may also include scanning and data acquisition electronics so that every pixel on the panel may be addressed (i.e., tested) in some fashion. Such specifically designed testing systems may utilize dark conditions (no energy stimulus) or visible light stimulus, as well as X-ray stimulus to test the flat panels, depending upon where the testing is inserted into the production process.

Currently, such engineering and manufacturing testing equipment is largely custom designed and is very expensive to develop. Typically, a new panel size means that a new set of development and production testing equipment needs to be designed and constructed. It is therefore highly desirable to maximize the reuse of such testing equipment between panels of differing physical sizes.

It should be appreciated that at least one embodiment of the present invention enables reusing existing capitol production and testing equipment (i.e., capitol production and testing equipment dedicated to a particular substrate size) for development as well as mass production of a new detector form factor panels, thereby reducing overall capitol expenditures. Reuse of existing capitol production equipment dedicated to a particular substrate size. It is further contemplated that existing fabrication equipment, such as panel moving robots for example, may be strategically sized to handle a single large substrate size. Embodiments of the presenting invention eliminates the need to develop new sized specific panel testers when designing and manufacturing an x-ray detector of a smaller size.

One embodiment of the present invention relates to a design and manufacturing process or method that enables reusing of development and manufacturing testing equipment from prior or existing production panel process to address the testing needs of new smaller form factor panels or active areas. It is contemplated that this type of relationship between form factor panels within a given application type may exist in Vascular and Rad type systems.

In at least one embodiment of the present invention the outer finger pattern of a prior existing panel size is recreated in a new smaller panel size by extending one or more of the contacts of the contact finger area of the new panel size. In at least one embodiment, a smaller panel is formed or manufactured on a substrate, where the substrate is equal in size to an existing larger panel or detector.

If the smaller panel does not have the same pixel pitch as the existing larger panel or detector, the finger connectors of the smaller panel may be fanned in or out to make contact with the testing equipment. It should be appreciated that in at least one embodiment, the total number of contacts of the smaller panel should equal, or at least not exceed, the number of contacts on the original testing equipment.

In at least one embodiment, the substrate is trimmed along one or more lines or borders to achieve the intended detector area size. It is contemplated that at least one or all of the finger contacts may be electrically connected to a guard band, where the guard band represents at least one of the lines or borders. Further, as in at least one embodiment, the smaller panel has a pixel pitch equivalent to the pixel pitch of the testing equipment, one or more extensions may be manufactured onto or otherwise connected or joined to one or more of the finger contacts. In at least one embodiment, manufacturing the panel further comprise scribing or cutting through one or more extended fingers so as to leave the panel in its final smaller size before attachment of additional readout electronics for example.

It is further contemplated that, in at least one embodiment, the active area and the substrate are separated. Such active area and the substrate may be separated using a known process commonly used in dicing single crystal wafers, glass scribing and the separation in amorphous silicon (silicon on glass). It is further contemplated that, one or more sidewalls of one or more finger contacts may be exposed during scribing. Therefore, in at least one embodiment the extensions may be made from a relatively inert metal, such as gold or ITO (Indium Tin Oxide) to maintain the integrity of the finger.

FIG. 1 illustrates a partially broken away view of a typical implementation of an X-ray or flat panel detector, generally designated 10. In the illustrated embodiment, the flat panel detector 10 comprises a flat panel 12, a substrate material 14 and readout electronics 16, which is electrically connected to the flat panel detector control. In the illustrated embodiment, flat panel 12 comprises a pixel array 18 (a semiconductor TFT pixel array, for example) on an X-ray converter material 20.

Figure 2:
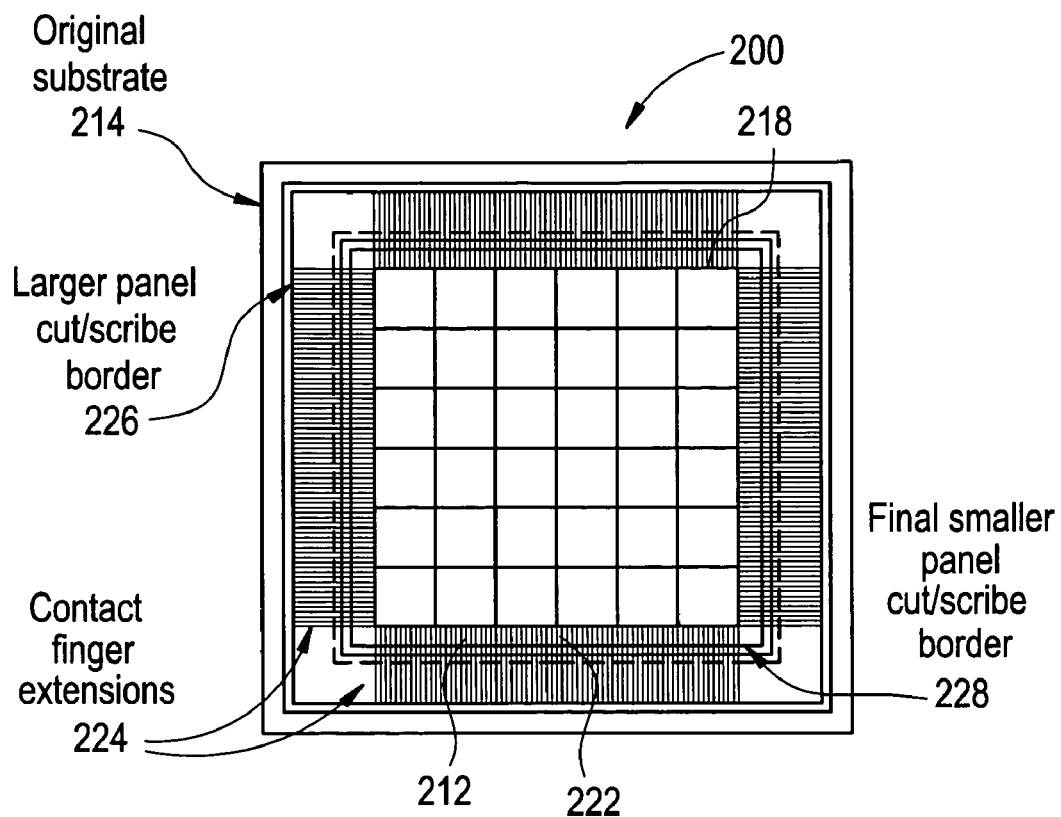
FIG. 2 illustrates a plan view of an active area or form factor panel formed on a substrate and having finger extensions in accordance with certain embodiments of the present invention.

FIG. 2 illustrates a plan view of a flat panel in a new smaller size used in a flat panel similar to that illustrated above in FIG. 1. In this embodiment, the flat panel detector 200 comprises an active area or panel 212 in a first size formed or manufactured on substrate material 214 in a second size. In at least one embodiment, a smaller panel 212 is formed or manufactured on substrate 214, which is equal to size to existing detector equipment.

FIG. 2 further illustrates that panel 212 comprises pixel array 218 and one or more edge finger contacts 222. In at least one embodiment of the present invention, the outer finger pattern of an original panel size is recreated in the new smaller panel size 212 by extending the contact finger area. In at least one embodiment, a contact finger extension 224 is attached or otherwise coupled to one or more of the finger contacts 222 such that the extended contact finger area is equivalent to the contact finger area of the original sized panel.

FIG. 2 further illustrates a larger panel cut/scribe border 226 and final smaller panel cut/scribe border 228. The borders 226 and 228 illustrate the lines along which, in one embodiment, at least the substrate is trimmed to achieve the intended detector area size. In at least one embodiment, a guard band (not shown) is electrically or mechanically connected to one or more fingers 222 or finger extensions 224. In the illustrated embodiment, the guard band is electrically or mechanically connected to all the finger contact extensions 224 and is, in the illustrated embodiment, represented by the large panel/cut scribe border 226.

In the illustrated embodiment, the panel 200 is cut along at least a portion of the large panel/cut scribe border 226. Then panel 200 is cut along at least a portion of the final smaller panel cut/scribe border 228. In at least one embodiment, this step involves cutting through the extended fingers so as to leave the panel in a final smaller size before attachment of additional readout electronics for example.

It should be appreciated if the panel 200 doesn't have the same pixel pitch as test equipment, the finger connectors and the extension may be fanned in or out to make contact with the test equipment. It should appreciated that the total number of contacts for the smaller panel should not exceed the number of finger contacts on the original test equipment.

Figure 3:
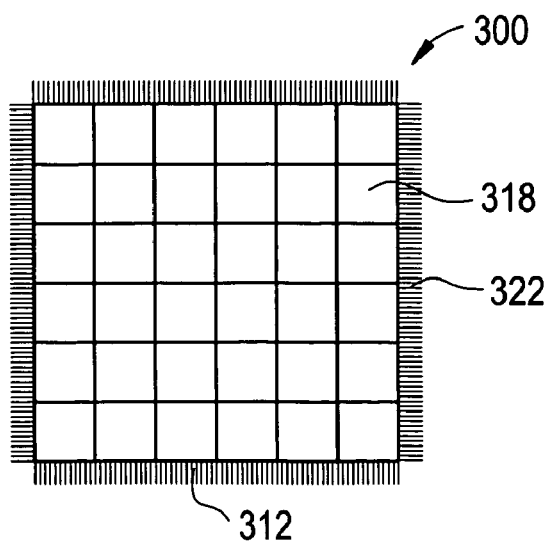
FIG. 3 illustrates a plan view of a final tested active area or form factor panel adapted to be used with an X-ray detector (similar to that illustrated in FIG. 1) in accordance with certain embodiments of the present invention.

FIG. 3 illustrates a final tested smaller panel, generally designated 300. In the illustrated embodiment, final test small panel 300 comprises flat panel 312 having pixel rate 318 and edge finger contacts 322. In at least one embodiment, the flat panel 312 is adapted to be used with an X-ray detector.

It is contemplated the final tested smaller panel 300 may be tested at any time during the manufacturing process using prior designed electromechanical contacting systems (engineering, production and manufacturing test equipment or systems for example), where such systems make temporary contact with the outside fingers of panel 300 and measure such parameters as interconnection integrity, TFT operation, diode performance (so that every pixel on the panel may be addressed), etc. Such specifically designed testing systems may utilize dark conditions (no energy stimulus) or visible light stimulus, as well as X-ray stimulus to test the flat panels, depending upon where the testing is inserted into the production process. It should be appreciated that an image generated or produced by panel 300 may be smaller in dimension than those generated or produced using larger active areas or panels. It is contemplated that the testing equipment may be modified to accommodate such smaller images.

One embodiment of the present invention relates to a method of designing and forming a smaller form flat panel which may be developed, manufactured and tested using existing production panel processes. FIG. 4 illustrates one embodiment of a method, generally designated 400, of forming a new smaller form flat panel.

In at least one embodiment of the present method the outer finger pattern of a prior existing panel size is recreated in a smaller panel size by extending one or more of the contacts of the contact finger area. In at least one embodiment, a smaller panel is formed or manufactured on a substrate, where the substrate is equal in size to an existing larger panel or detector.

If the smaller panel does not have the same pixel pitch as the existing larger panel or detector, the finger connectors in the extension area may be fanned in or out to make contact with the test equipment. It should be appreciated that in at least one embodiment, the total number of contacts of the smaller panel should equal, or at least not exceed, the number of contacts on the original testing equipment.

More specifically, in at least one embodiment, method 400 comprises Step 410, manufacturing at least one panel in a first size on a substrate of a second size. While in one embodiment, the substrate of a second size is larger than a substrate of the first size, different relationships between the two substrates are contemplated. Method 400 further comprises Step 412, extending the finger contact area of the at least one panel. Method 400 further comprises Step 414, trimming the substrate, forming at least one panel of a first size.

It if further contemplated that, in at least one embodiment, the substrate is trimmed along one or more lines or borders to achieve the intended detector area size. It is contemplated that at least one or all the finger contacts may be electrically connected to a guard band, where the guard band represents at least one of the lines or borders. Further, as in at least one embodiment, the smaller panel has a pixel pitch equivalent to the pixel pitch of the testing equipment, one or more extensions may be manufactured onto one or more of the finger contacts. In at least one embodiment, manufacturing the panel further comprise scribing or cutting through one or more extended fingers so as to leave the panel in its final smaller size before attachment of additional readout electronics.

It is also contemplated that, in at least one embodiment, the active area and the panel are separated. Such active area and the substrate may be separated using a known process commonly used in dicing single crystal wafers or in glass scribing and the separation in amorphous silicon (silicon on glass). It is further contemplated that, one or more sidewalls of one or more finger contacts may be exposed during the scribing. Therefore, in at least one embodiment the extensions may be made from a relatively inert metal, such as gold or ITO (Indium Tin Oxide), to maintain the integrity of the finger.

It is contemplated the panel formed in accordance with method 400 may be tested at any time during the method using prior designed electromechanical contacting systems (engineering, production and manufacturing test equipment or systems for example), where such systems make temporary contact with the outside fingers of panel. It should be appreciated that an image generated or produced by the panel may be smaller in dimension than those generated or produced using larger active areas or panels. It is contemplated that the testing equipment may be modified to accommodate such smaller images.

Yet another embodiment of the present invention relates to a method of forming one or more small flat panels which may be formed and tested using existing development manufacturing test equipment and further be using system production panel process. FIG. 5 illustrates one embodiment of method, generally designated 500, for manufacturing one or more small panels. In this embodiment, method 500 comprises Step 510, manufacturing at least one panel in a first size one a substrate of a second size. In one embodiment, the second size is larger than the first size, although other arrangements are contemplated including the second size being the same size as the first size.

Method 500 further comprises Step 512, electrically connecting at least one finger of the panel to at least one guard band. In other embodiments, more that one finger, or all the fingers, is connected to at least the one guard band. Furthermore, while only one guard band is discussed, a plurality of guard bands are contemplated. For example, four guard bands may be used, one guard band on each side of the panel, where the guard bands are connected.

Method 500 comprises Step 514, determining if the pixel pitch of the fingers is equivalent to the test equipment. If the pixel pitch is not equivalent to the test equipment, then the method 500 comprises Step 532, fanning one or more fingers in/out. The one or more fingers are fanned in and out until the pixel pitch is equivalent. If method 500 further comprises Step 534, determining if one or more fingers extension are required. If finger extensions are required, one or more finger extensions are added to at least one finger of the panel as indicated in Step 536. Method 500 further comprises Step 538, trimming the substrate to form at least one panel of the first size.

In at least one embodiment, where the substrate is cut down to the final panel or first size, the sidewall of the finger may become exposed. It is contemplated that the use of a stable conductor metallization is essential to provide for long term reliability of at least the contact. In the at least one embodiment of the present invention (indium tin oxide alternative referred to as "ITO") is used in such stable conductor metallization although other metallization (Gold for example) may be used depending upon the major panel metallization system.

It is contemplated the panel formed in accordance with method 500 may be tested at any time during the method using prior designed electromechanical contacting systems (engineering, production and manufacturing test equipment or systems for example), where such systems make temporary contact with the outside fingers of panel. It should be appreciated that an image generated or produced by the panel may be smaller in dimension than those generated or produced using larger active areas or panels. It is contemplated that the testing equipment may be modified to accommodate such smaller images.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

The invention claimed is:

1. A method for manufacturing a plurality of flat panel X-ray detectors, each flat panel X-ray detectors having at least one active area, comprising:
   forming at least one active area of a first size on a substrate of a second size;
   electrically connecting a plurality of finger contacts of said at least one active area to at least one guard band;
   determining if a pixel pitch of said plurality of finger contacts in equivalent to a pixel pitch of testing equipment;
   determining if at least one finger extension is required;
   trimming said substrate to said first size; and
   stabilizing at least one sidewall of at least one of said plurality of finger contacts, forming the plurality of flat panel X-ray detectors having the at least one active area.

2. The method of claim 1 comprising fanning out said plurality of fingers if said pixel pitch is not equivalent to said pixel pitch of said testing equipment.

3. The method of claim 1 comprising fanning in said plurality of fingers if said pixel pitch is not equivalent to said testing equipment.

4. The method of claim 1 comprising adding at least one contact extension to at least one finger contact of said plurality of finger contacts.

5. The method of claim 1 comprising stabilizing at least one of said plurality of finger contacts using stable conductor metallization.

6. The method of claim 5 comprising using indium tin oxide to stabilize at least one of said finger contacts.

\* \* \* \* \*